(12) United States Patent
Zhang et al.

(10) Patent No.: US 7,974,134 B2
(45) Date of Patent: Jul. 5, 2011

(54) VOLTAGE GENERATOR TO COMPENSATE SENSE AMPLIFIER TRIP POINT OVER TEMPERATURE IN NON-VOLATILE MEMORY

(75) Inventors: Fanglin Zhang, Fremont, CA (US); Jong Park, Campbell, CA (US); Man Mui, Santa Clara, CA (US); Alexander Chu, San Francisco, CA (US); Seungpil Lee, San Ramon, CA (US)

(73) Assignee: SanDisk Technologies Inc., Plano, TX (US)

( * ) Notice: Subject to any disclaimer, the term of this patent is extended or adjusted under 35 U.S.C. 154(b) by 62 days.

(21) Appl. No.: 12/617,860

(22) Filed: Nov. 13, 2009

(65) Prior Publication Data

US 2011/0116320 A1   May 19, 2011

(51) Int. Cl.
*G11C 16/06* (2006.01)
(52) U.S. Cl. .................. 365/185.21; 365/196; 365/207; 365/189.09; 365/210.12
(58) Field of Classification Search ............. 365/185.21, 365/196, 207, 189.09, 210.12
See application file for complete search history.

(56) References Cited

U.S. PATENT DOCUMENTS

| | | | |
|---|---|---|---|
| 3,936,725 A | 2/1976 | Schneider | |
| 4,471,292 A | 9/1984 | Schenck | |
| 4,550,284 A | 10/1985 | Sooch | |
| 6,072,733 A | 6/2000 | Advani | |
| 6,339,319 B1 | 1/2002 | Clapp, III | |
| 6,560,152 B1 | 5/2003 | Cernea | |
| 6,586,987 B2 * | 7/2003 | Somerville et al. | 327/542 |
| 6,801,454 B2 | 10/2004 | Wang | |
| 7,057,958 B2 | 6/2006 | So | |
| 7,324,380 B2 | 1/2008 | Negut | |
| 7,327,619 B2 | 2/2008 | Chan | |
| 7,447,079 B2 | 11/2008 | Nguyen | |
| 2002/0018369 A1 | 2/2002 | Ogura | |
| 2006/0158947 A1 | 7/2006 | Chan | |
| 2008/0224221 A1 | 9/2008 | Yang | |
| 2009/0003068 A1 | 1/2009 | Lee | |
| 2009/0160557 A1 | 6/2009 | Luzzi | |

OTHER PUBLICATIONS

Casdode Current Mirror, RF, RFIC & Microwave Theory, Design, 10 pages, www.ific.co.uk, printed Nov. 3, 2009.

* cited by examiner

*Primary Examiner* — Thong Q Le
(74) *Attorney, Agent, or Firm* — Vierra Magen Marcus & DeNiro LLP

(57) ABSTRACT

In a non-volatile memory system, a voltage generator provides a voltage to a gate of a voltage-setting transistor which is used in a sense circuit to set an initial voltage at a sense node. At the end of a sense period, a final voltage of the sense node is compared to a trip point, which is the threshold voltage of a voltage-sensing transistor. To account for temperature variations and manufacturing process variations, the voltage generator includes a transistor which is matched to the voltage-setting transistor, and a transistor which is matched to the voltage-sensing transistor. As a result, a voltage swing between the initial voltage and the trip point is constant, even as the initial voltage and trip point vary. In a particular implementation, the voltage generator uses a cascode current mirror circuit, and receives a reference current from a band gap voltage circuit.

20 Claims, 9 Drawing Sheets

VOLTAGE GENERATOR TO COMPENSATE SENSE AMPLIFIER TRIP POINT OVER TEMPERATURE IN NON-VOLATILE MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

During a programming operation, data is stored in a storage element by providing the Vth of the storage element in a predefined range which corresponds to a data state. Memory devices with four, eight or sixteen date states are known. However, with the use of a larger number of data states, and a corresponding decrease in the separation between states, it is more difficult to read back the data states with high fidelity.

DETAILED DESCRIPTION

A method and non-volatile storage system are provided in which a sensing operation compensates for temperature and process variations.

Sensing operations can be affected by temperature variations and manufacturing process variations. Temperature variations affect the threshold voltages of transistors used in sensing components. Manufacturing process variations can include variations in the physical size of transistors from ideal dimensions. A "corner" case represents a most severe variation. As a result, the fidelity of a sensing operation can be impacted. Moreover, this impact will become more critical for multi-level memory devices which use increasing numbers of data states and corresponding smaller separations between states. In one aspect, a sensing component includes a voltage-setting transistor which receives a voltage at its control gate from a voltage generator. The voltage-setting transistor sets an initial voltage at a sense node of the sensing component. The sense node is allowed to discharge into a bit line during a sensing operation to determine if a non-volatile storage element connected to the bit line is in a conductive or non-conductive state. If the sense node discharges below a trip point, the non-volatile storage element is in a conductive state. If the sense node does not discharge below a trip point, the non-volatile storage element is in a non-conductive state. The trip point is set by a voltage-sensing transistor in the sensing component. The voltage generator includes transistors which are matched to the voltage-setting transistor and the voltage-sensing transistor so that an output voltage is compensated. As a result, a difference between the initial voltage level and the final level at the trip point is maintained substantially constant, even as the initial level and the trip point vary.

Figure 1A:
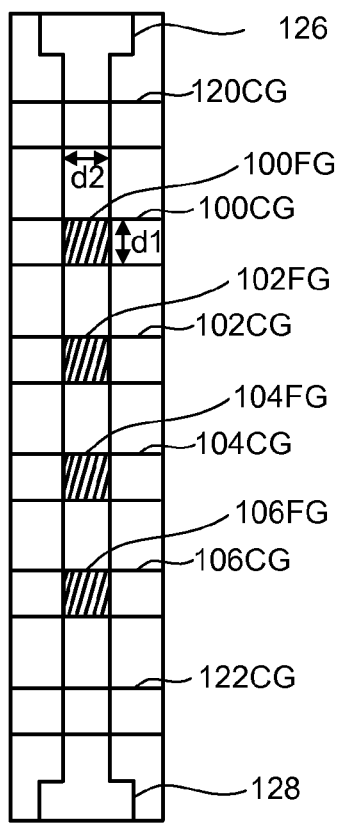
FIG. 1a is a top view of a NAND string.
Figure 1B:
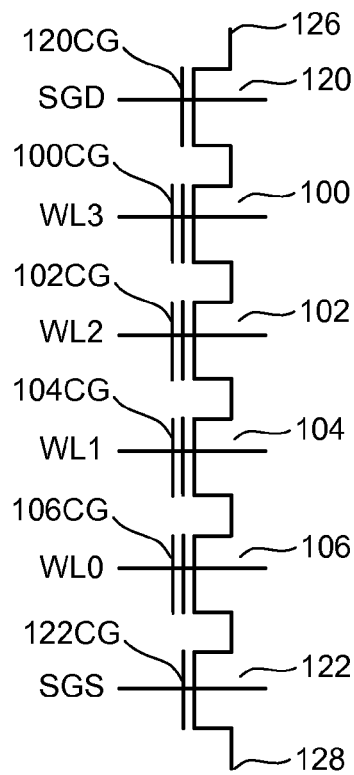
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate (100CG, 102CG, 104CG and 106CG) and a floating gate (100FG, 102FG, 104FG and 106FG). Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

A transistor in general can be characterized by a length across a plane, a width which is in the same plane as the length but orthogonal to the length, and an orientation relative to the plane. For the example transistor 100, d1 is a length of the transistor in a bit line direction (vertically on the page), and d2 is a width of the transistor 100 in the word line direction (horizontally on the page). Further, the NAND string and its transistors are arranged in a specified direction or orientation on a substrate, such as a silicon die. For instance, the orientation can be defined relative to crystallographic axes in the substrate or based on any other desired frame of reference.

Figure 2:
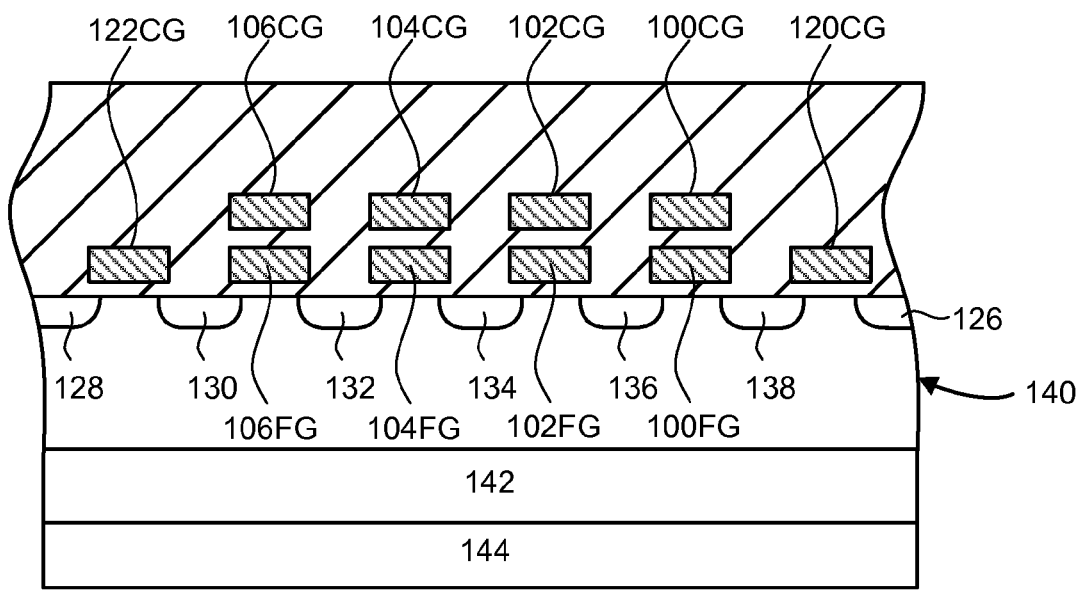
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
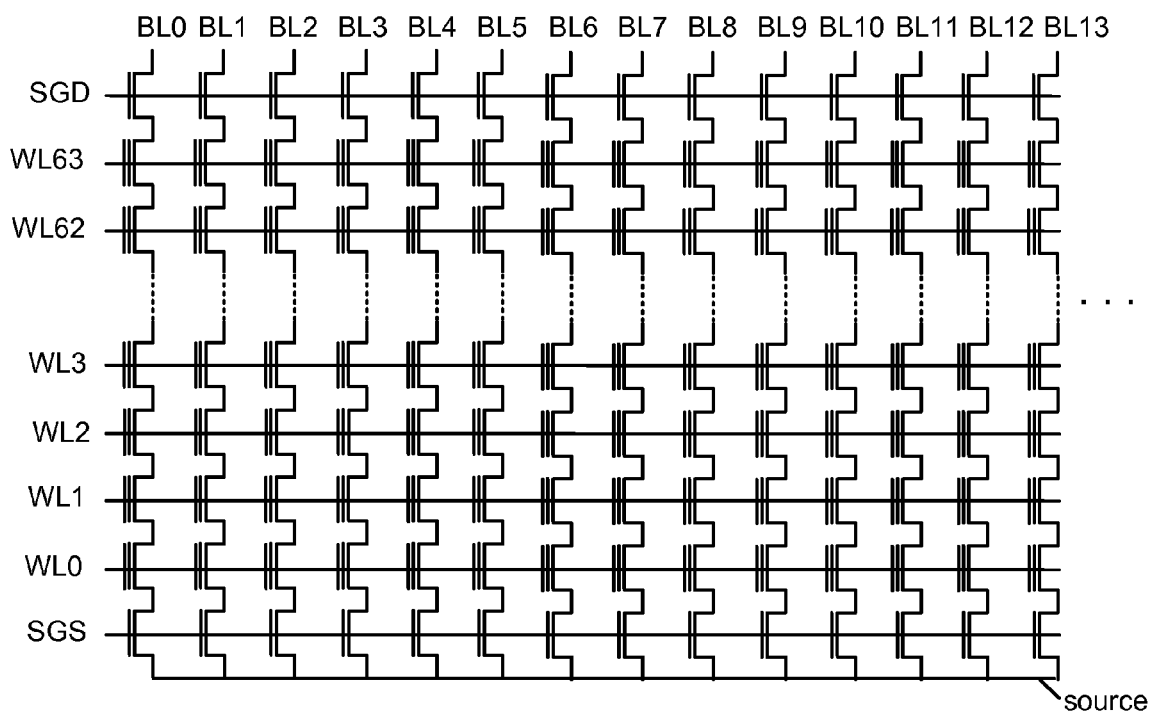
FIG. 3 depicts a block of NAND flash memory cells.

FIG. 3 depicts a block of NAND flash memory cells. The block includes a number of NAND strings and respective bit lines, e.g., BL0, BL1, . . . . Each NAND string is connected at one end to a drain select gate (SGD), and the control gates of the drain select gates are connected via a common SGD line. The NAND strings are connected at their other end to a source select gate which, in turn, is connected to a common source line. Sixty-four word lines, for example, WL0-WL63, extend between the source select gates and the drain select gates.

Figure 4:
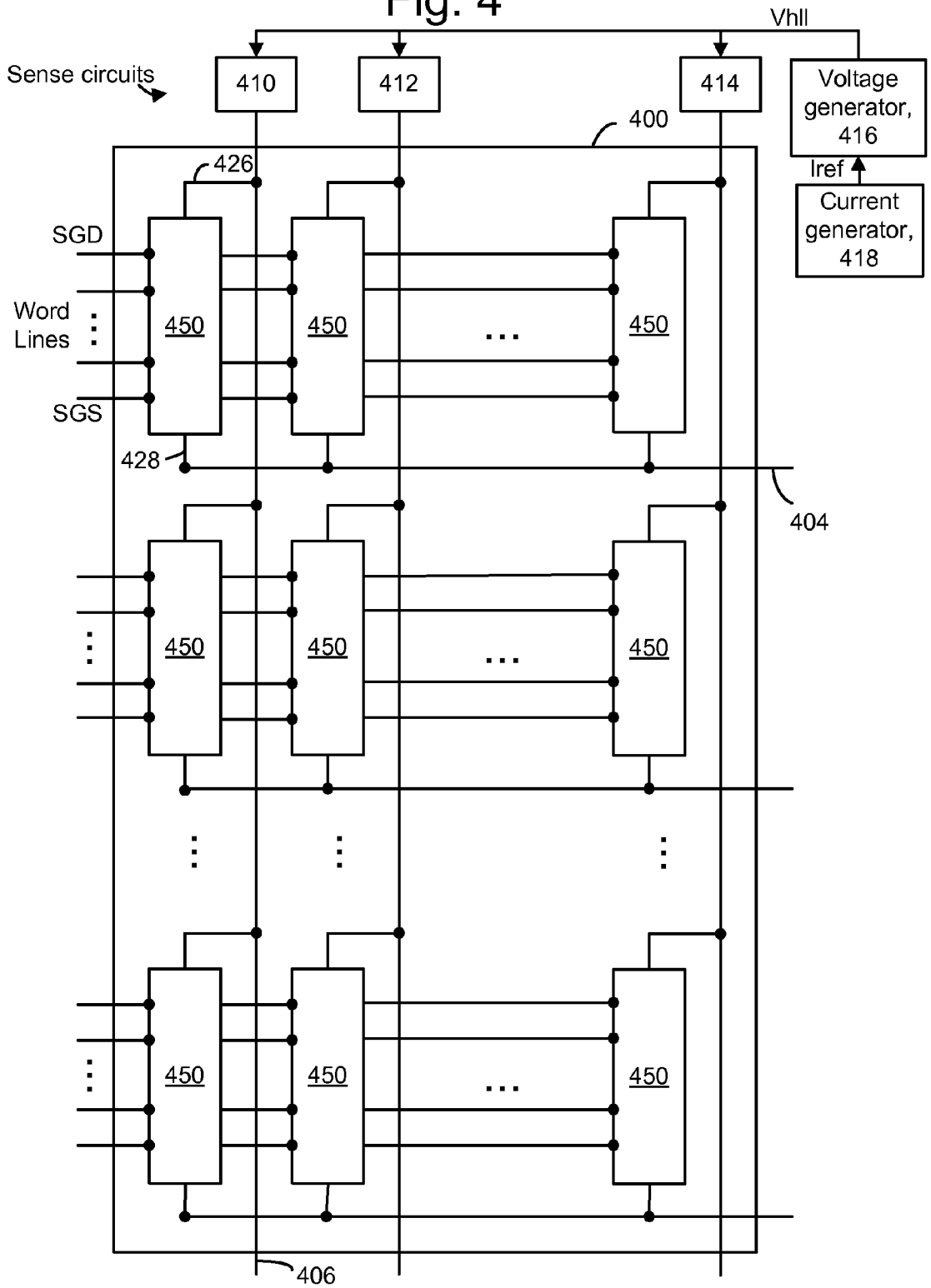
FIG. 4 is a block diagram of an array of NAND flash memory cells.

FIG. 4 illustrates an example of an array 400 of NAND cells, such as those shown in FIGS. 1*a*-2. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Additionally, sense circuits such as sense amplifiers can be connected to each bit line, or shared among bit lines.

Examples include sense circuits 410, 412, ..., 414. A voltage generator 416 provides a voltage Vhll to each sense circuit for use in setting a voltage of a sense node in each sense circuit during sensing operations involving the associated bit lines and one or more selected storage elements. Vhll may be provided in response to a reference current, Iref, from a current generator 418, as discussed further below.

Figure 5:
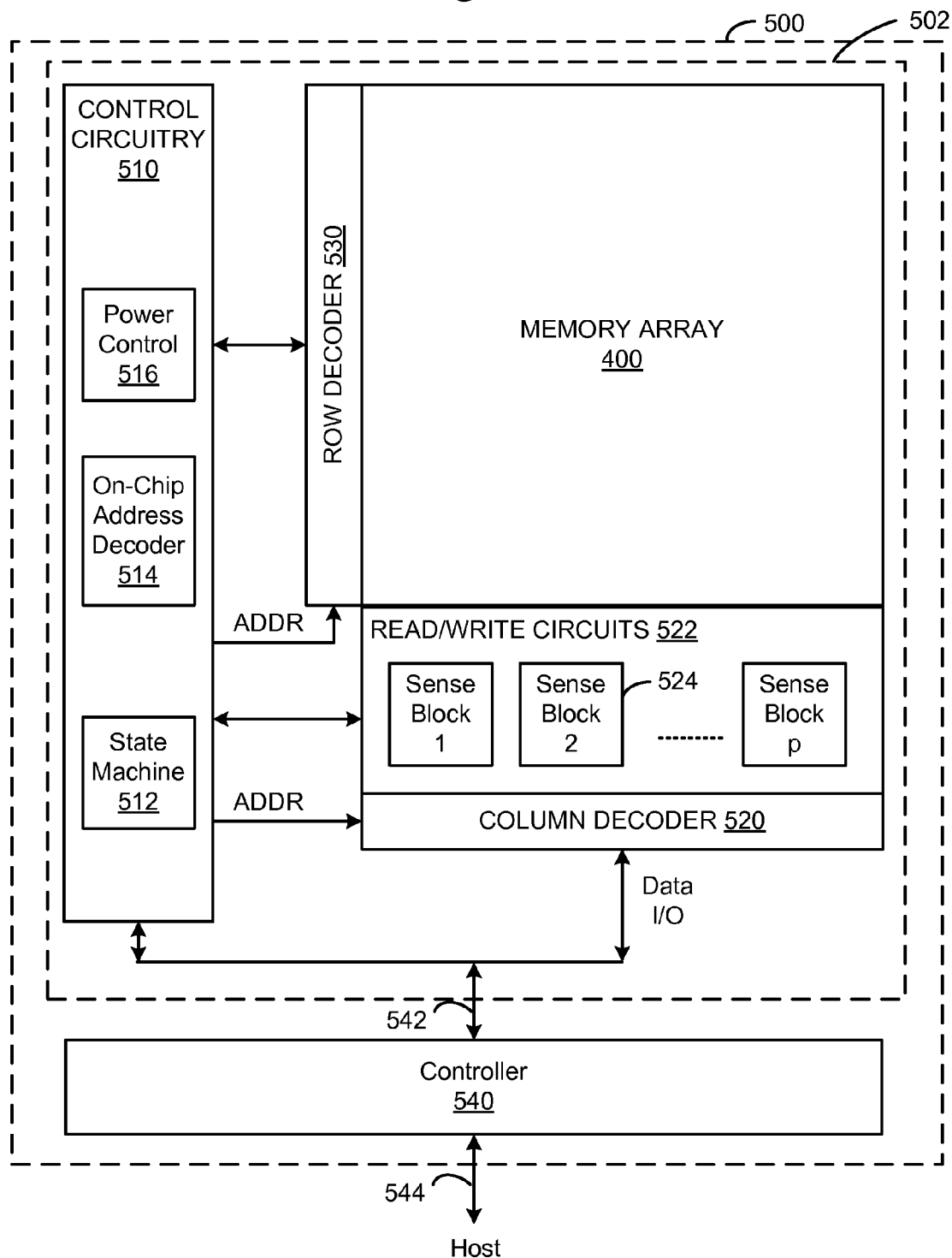
FIG. 5 is a block diagram of a non-volatile memory system.

FIG. 5 illustrates a memory device 500 having read/write circuits for reading and programming a page of memory cells in parallel, according to one embodiment. Memory device 500 may include one or more memory die 502. Memory die 502 includes a two-dimensional array of memory cells 400, control circuitry 510, and read/write circuits 522. The memory array 400 is addressable by word lines via a row decoder 530 and by bit lines via a column decoder 560. The read/write circuits 522 include multiple sense blocks 524 and allow a page of memory cells to be read or programmed in parallel. Typically, a controller 540 is included in the same memory device 500 (e.g., a removable storage card) as the one or more memory die 502. Commands and Data are transferred between the host and controller 540 via lines 544 and between the controller and the one or more memory die 502 via lines 542.

The control circuitry 510 cooperates with the read/write circuits 522 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 520. The power control module 516 controls the power and voltages supplied to the word lines and bit lines during memory operations. The voltage generator 416 and the current generator 418 of FIG. 4 may be provided in the power control module 516, for instance.

In another approach, dual row/column decoders and read/write circuits are used. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half. Each sense circuits 410, 412, ..., 414 of FIG. 4 may be considered to be part of a respective one of the sense blocks 524, for instance.

Figure 6:
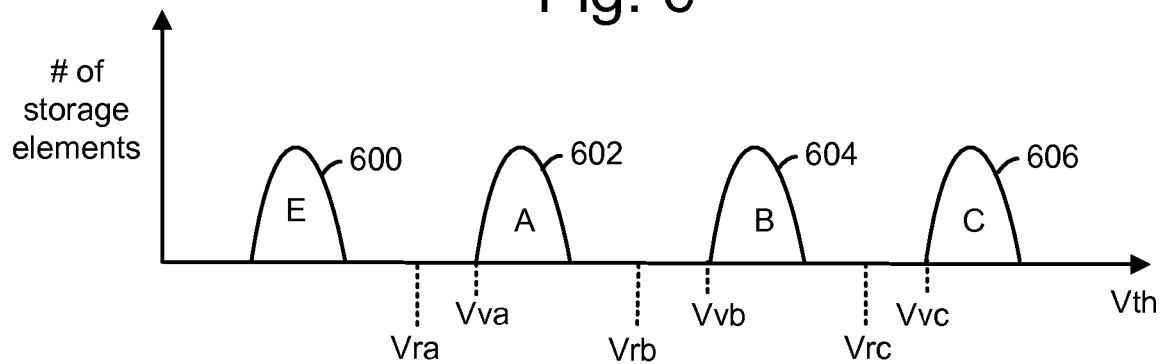
FIG. 6 depicts an example set of threshold voltage distributions.

FIG. 6 depicts an example set of threshold voltage distributions for a storage element array for a case where each storage element stores N=2 bits of data, and there are $2^N=4$ data states. A first threshold voltage distribution 600 is provided for erased (E state) storage elements, while threshold voltage distributions 602, 604 and 606 represent programmed states A, B and C, respectively. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, B or C, the system will test whether those storage elements have a threshold voltage greater than or equal to Vva, Vvb or Vvc, respectively. Various program schemes are known, includes single pass and multiple-pass schemes. As mentioned, four, eight, sixteen or even more data states can be provided. Generally, $2^N-1$ sense levels are used when there are $2^N$ states.

Figure 7A:
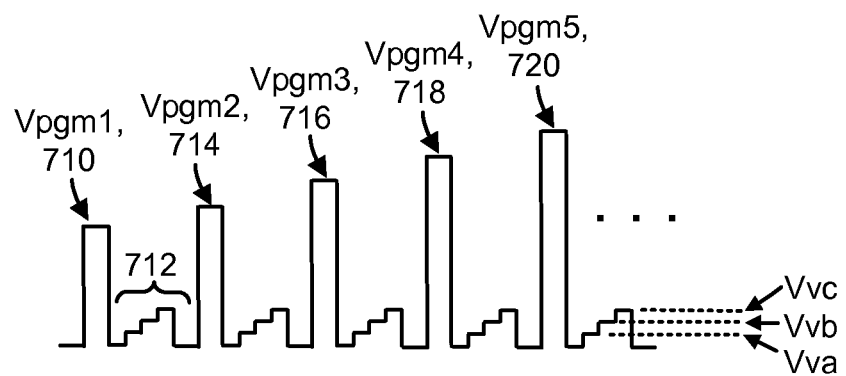
FIG. 7a depicts a voltage waveform applied to the control gates of storage elements during a program/verify operation.

FIG. 7a depicts a voltage waveform applied to the control gates of storage elements during a program operation. The waveform or pulse train includes program pulses 710, 714, 716, 718 and 720 ..., and a set of verify pulses between each program pulse, including example verify pulses 712, such as Vva, Vvb and Vvc. The program pulses can be fixed in amplitude, or they can step up by a fixed or varying step size, for instance. When each verify pulse is applied, a sense operation is performed for selected storage elements which are to be programmed to a particular target data state which is associated with the verify pulse, to evaluate the storage element's Vth relative to the verify voltage.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. For example, verify pulses may be provided only for state A initially, then for states A and B, and then for states B and C. The waveform may be used during all bit line programming, for instance, in which storage elements of even- and odd-numbered bit lines are programmed together, and verified together. Or, the verify operation can be performed separately, e.g., first for the even-numbered bit lines and then for the odd-numbered bit lines.

Figure 7B:
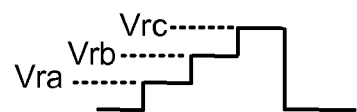
FIG. 7b depicts a voltage waveform applied to the control gates of storage elements during a read operation.

FIG. 7b depicts a voltage waveform applied to the control gates of storage elements during a read operation. For example, voltages such as Vra, Vrb and Vrc can be applied. Sensing operations include both verify and read operations.

Figure 8:
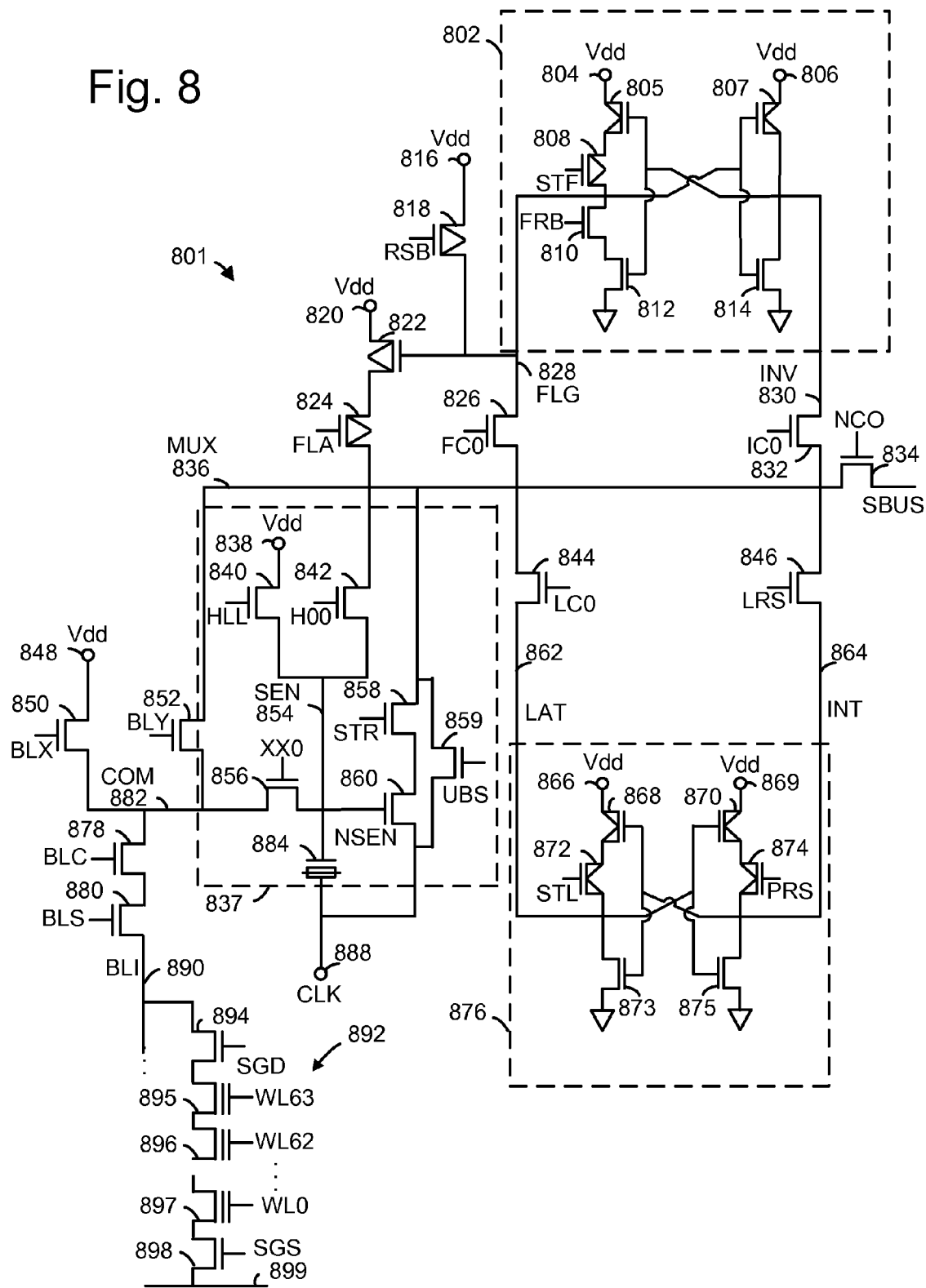
FIG. 8 depicts one example implementation of a sense circuit.

FIG. 8 depicts one example implementation of a sense circuit 801, which can be used to provide one of the sense circuits 410, 412, ..., 414 in FIG. 4. The transistors depicted can include n-type metal-oxide-semiconductor field-effect transistor (MOSFETs) and partially-insulated field-effect transistors (PiFETs), for instance. The sense circuit 801 includes, generally, a sense portion 837, a flag portion 802 and a latch portion 876. The flag portion 802 sets a flag FLG on path 828 to high or low. INV on path 830 is the inverse of FLG. Nodes 804 and 806 receive a local power supply Vdd. STF transistor 808 and FRB transistor 810 receive appropriate control signals to provide the desired FLG level. In this implementation, the STF transistor 808 is a PiFET, and the symbol used to identify it is as a PiFET is used elsewhere in FIG. 8 to identify other PiFETs. Also, the FRB transistor 810 is an nMOS, and the symbol used to identify it is as an nMOS is used elsewhere in FIG. 8 to identify other nMOSs.

A gate of a transistor 805 is connected to a transistor 812 of a ground path. Similarly, a gate of a transistor 807 is connected to a transistor 814 of a ground path.

With FLG high, a transistor 822 is non-conductive. Transistor 822, when conductive, couples a power supply terminal 820 to a FLA transistor 824.

An NCO transistor 834 connects a MUX path 836 to a sense bus (SBUS) for input and output of data. An IC0 transistor 832 controls whether the INV path 830 communicates with the MUX path 836. An FC0 transistor 826 controls whether the FLG path 828 communicates with the MUX path 836.

A reset or RSB transistor 818 controls whether a power supply node 816 communicates with the FLG path 828.

In the latch portion 876, a latch value LAT is set on path 862 to high or low. INT on path 864 is the inverse of LAT. Nodes 866 and 869 receive Vdd. STL transistor 872 and PRS transistor 874 receive appropriate control signals to provide the desired LAT level. A gate of transistor 868 is connected to a transistor 873 of a ground path. Similarly, a gate of transistor 870 is connected to a transistor 875 of a ground path.

An LC0 transistor 844 controls whether the LAT path 862 communicates with the MUX path 836. An LRS transistor 846 controls whether the INT path 864 communicates with the MUX path 836.

The sense portion 837, which is used during a verify or read operation, includes a sense path or node 854, a XX0 transistor 856 which controls whether the sense path communicates with the COM path 882, an HLL transistor 840 which controls whether the sense path communicates with a power supply node 838, and an H00 transistor 842 which controls whether the sense path communicates with the MUX path 836. The HLL and H00 transistors can be used for lock out or no lock out sensing, respectively. The SEN path 854 is coupled to a control gate of an NSEN transistor 860, and an STR transistor 858 controls whether the transistor 860 communicates with the MUX path 836. A UBS transistor 859 provides a bypass to the STR transistor 858 and the NSEN transistor 860. A clock CLK signal is provided at a node 888 to a dynamic capacitor 884.

A BLY transistor 852 controls whether the MUX path 836 communicates with the COM path 882, while a BLX transistor 850 controls whether the COM path 882 communicates with a power supply node 848. The BLC transistor 878 and BLS transistor 880 control whether the COM path 882 communicates with the bit line BLI 890. The bit line 890 may communicate with one or more NAND strings, such as depicted in FIG. 4. An example NAND string 892 includes a drain select gate SGD 894, storage elements 895, 896, . . . , 897 whose control gates communicate with word lines WL63, WL62, WL0, respectively, for example, and a source select gate SGS 898 which communicates with a source line 899. The NAND string 892 is not part of the sensing circuit 801.

Generally, a sensing operation such as a read operation can involve applying a control gate voltage such as Vra, Vrb or Vrc to a selected storage element in the NAND string 892. A sensing operation such as a verify operation can involve applying a control gate voltage such as Vva, Vvb or Vvc to a selected storage element. The control gate voltage can be applied via a corresponding word line to multiple selected storage elements in corresponding multiple NAND strings at the same time. Each NAND string may have a sense circuit, in one possible approach. The control gate voltages of other, unselected storage elements in the NAND string 892 and other NAND strings are raised to a level (referred to as a read pass level) which is sufficient to render the unselected storage elements conductive. With the control gate voltage applied, the sense circuit 801 is controlled to interact with the selected storage element, via a respective bit line, to determine the state of the storage element. Typically, a conductive or non-conductive state of the selected storage can be determined.

In one possible implementation, the HLL transistor 840 receives a voltage Vhll at its control gate which sets an initial voltage level of the sense node 854 as Vhll−Vth, where Vth is a threshold voltage of the HLL transistor 840. Essentially, the HLL transistor allows a portion of the supply voltage Vdd at node 838 to reach the sense node. The HLL transistor 840 may therefore be considered to be a voltage-setting transistor. The voltage applied to the sense node is considered to provide a pre-charge of the sense node. At this time, the sense node is not allowed to communicate with the bit line 890 by providing the XX0 transistor 856 in a non-conductive state. Subsequently, Vhll is lowered so that the HLL transistor 840 becomes non-conductive, and the sense node is cutoff from the supply node 838. The XX0 transistor 856 is controlled to be in a conductive state, so that the sense node can discharge into the bit line, the unselected storage elements, and the selected storage element, if the selected storage element is in a conductive state. If the selected storage element is in a non-conductive state, the sense node will not appreciably discharge into the bit line.

When the XX0 transistor 856 is conductive, a path from node 848 to the bit line 890, via the BLX transistor 850, is also conductive. Node 848 is at a higher voltage than the sense node, so the current from the sense node will go towards the bit line until the sense node drops below a certain level. Once the sense node is below the BLX voltage, there will not be any more current flowing through the XX0 transistor 856 to the bit line 890. Instead, all current coming to the bit line will be from the BLX transistor 850. Note that the CLK signal is at ground.

At a predetermined sensing time after discharging starts, the sense node is sensed to determine its voltage. In one possible approach, the NSEN transistor 860 performs this task. If the sense node voltage is above the threshold voltage of the NSEN transistor 860, the NSEN transistor 860 will be in a conductive state. This means the discharge of the sense node was not appreciable, and it can be concluded that the selected storage element is in a non-conductive state. On the other hand, if the sense node voltage is at or below the threshold voltage of the NSEN transistor 860, the NSEN transistor 860 will be in a non-conductive state. This means the discharge of the sense node was appreciable, and it can be concluded that the selected storage element is in a conductive state. The NSEN transistor 860 may therefore be considered to be a voltage-sensing transistor. A latch value is set to 0 or 1 and output via the bus to a controller according to whether the NSEN transistor 860 is in a conductive or non-conductive state, indicating that the selected storage element is in a non-conductive or conductive state, respectively. For example, the FLG node 828 is reset to high, and the STR transistor 858 and the FC0 transistor 826 can be made conductive to attempt to flip the FLG latch. The latch is flipped if NSEN 860 is conductive, or not flipped if NSEN is not conductive.

The circuit of FIG. 8 is one possible implementation of a sense circuit. Other implementations are possible.

Figure 9:
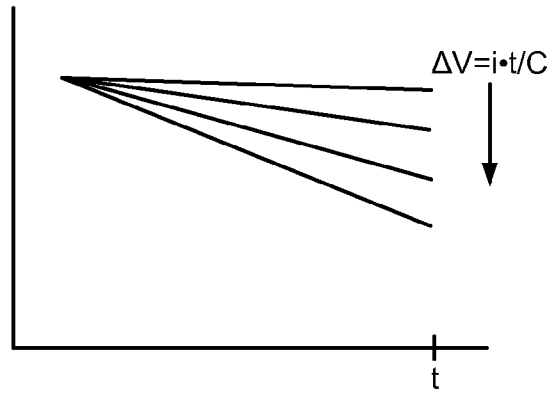
FIG. 9 depicts voltage drop with time for different lines of fixed current, during a current sensing operation.

FIG. 9 depicts voltage drop with time for different lines of fixed current, during a current sensing operation. In one possible approach, the sense circuit 801 performs current sensing by determining a voltage drop at the sense node which is tied to a fixed current flow by the relationship $\Delta V = i \cdot t / C$, where $\Delta V$ is the voltage drop at the sense node (and the bit line), i is the fixed current, t is a predetermined discharge time period and C is the capacitance of the pre-charged capacitor 884. A greater voltage drops represent higher currents. For example, $\Delta V1=i1 \cdot t/C$, $\Delta V2=i2 \cdot t/C$, $\Delta V3=i3 \cdot t/C$, and $\Delta V4=i4 \cdot t/C$, where $\Delta V1<\Delta V2<\Delta V3<\Delta V4$ and $i1<i2<i3<i4$. At the end of a given discharge period, since i and C are fixed, $\Delta V$ for a given current can be determined. In one approach, the NSEN transistor 860 is used to determine a level of $\Delta V$ relative to a demarcation value or trip point, which is the threshold voltage of the transistor 860.

Voltage sensing, in contrast, does not involve sensing a voltage drop which is tied to a fixed current. Instead, voltage sensing involves determining whether charge sharing occurs between a capacitor in a sensing circuit and a capacitance of the bit line. Current is not constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The sensing circuit 801 thus can determine whether the selected storage element is in a conductive or non-conductive state by the level of current. Generally, a higher current will flow (corresponding to a greater voltage discharge of the sense node) when the selected storage element is in a conductive state and a lower current, or essentially no current, will flow (corresponding to a lesser voltage discharge of the sense node) when the selected storage element is in a non-conductive state. It can be concluded that a threshold voltage of the selected storage element is above or below a compare level, such as a verify level or a read level, when it is in a non-conductive state or a conductive state, respectively.

Figure 10:
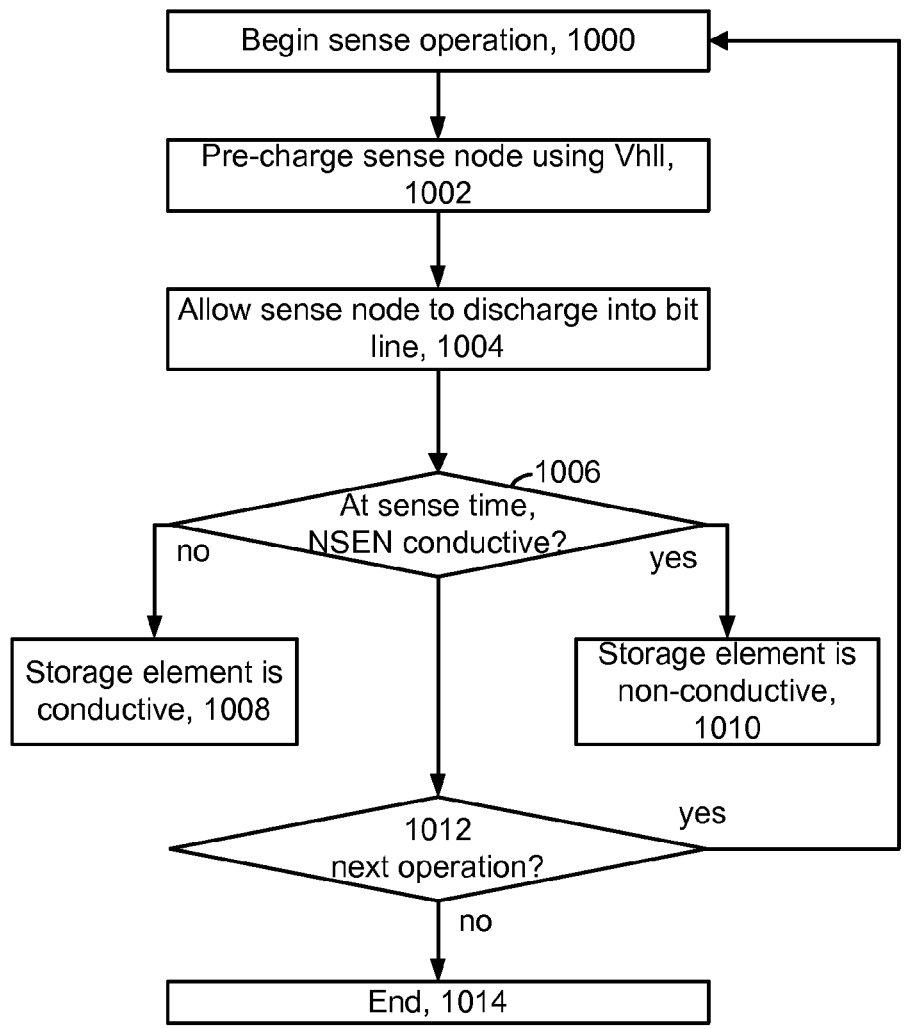
FIG. 10 depicts a sensing process.

FIG. 10 depicts a sensing process. A sense operation, such as a read or verify operation, begins at step 1000. The sense node in the sense circuit is pre-charged at step 1002. At step 1004, the sense node is allowed to discharge into the bit line. At decision step 1006, a determination is made as to whether NSEN is in a conductive state, indicting that the sense node potential exceeds a threshold voltage of the NSEN transistor as a trip point. If decision step 1006 is true, it is concluded that the storage element is in a non-conductive state (step 1010). If decision step 1006 is false, it is concluded that the storage element is in a conductive state (step 1008). At decision step 1012, if there is a next sense operation, processing continues at step 1000. At decision step 1012, if there is not a next sense operation, processing ends at step 1014.

Figure 11:
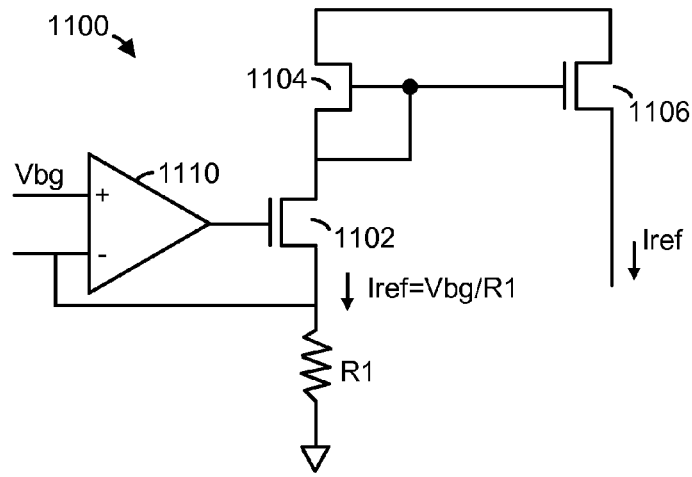
FIG. 11 depicts a reference current source.
Figure 12:
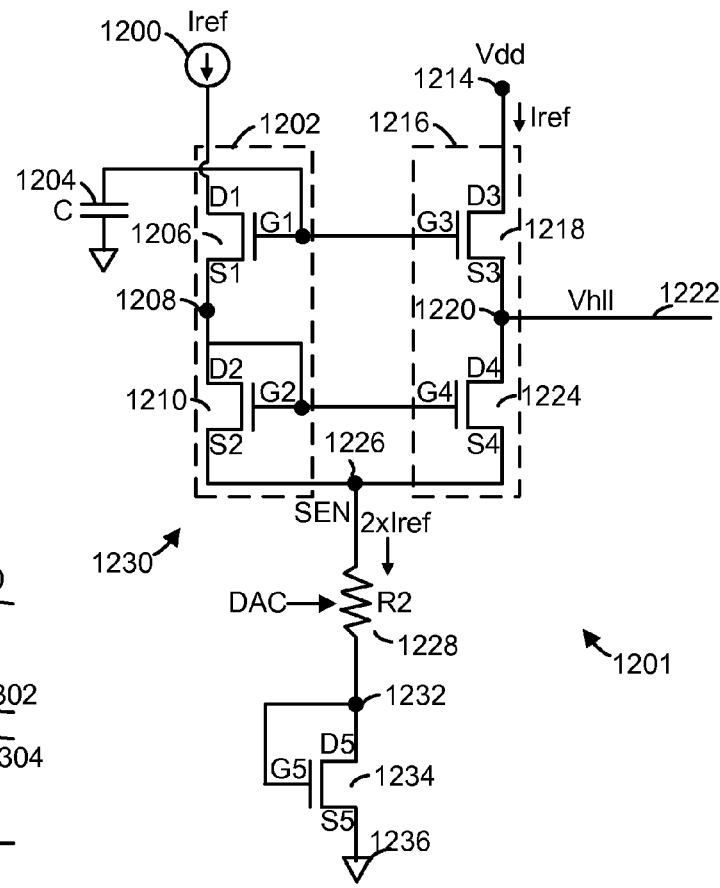
FIG. 12 depicts a voltage generator.

FIG. 11 depicts a reference current generator which provides a reference current for a voltage generator such as depicted in FIG. 12. In a reference current source circuit 1100, an operational amplifier 1110 receives a bandgap reference voltage, Vbg, at a non-inverting input terminal. Vbg can be provided by a bandgap reference voltage circuit, which provides a temperature-independent voltage, usually with an output voltage which is close to the theoretical 1.22 eV bandgap of silicon at 0 K. The output of the amplifier controls a gate of a transistor 1102, and is fed back to an inverting input terminal of the amplifier. The transistor 1102 is in a primary path of a current minor circuit, along with a transistor 1104 and a resistor R1, which is connected to ground. A current which is generated is Iref=Vbg/R1. This current is mirrored to a minor path of the circuit to provide Iref. Iref has a temperature dependence since R1 has a temperature dependence.

In the circuitry of FIG. 12, Iref is provided by a reference current source 1200, such as provided in FIG. 11. The circuitry includes a current minor circuit 1230 which includes a reference path 1202 and a mirror path 1216 in which Iref is mirrored. The circuit 1230 may be provided in a cascode or source follower configuration, so that the circuit 1230 is a cascode current mirror circuit in which the reference current path 1202 is a reference cascode, and the minor current path 1216 is a mirror cascode. The reference current path 1202 includes an upper transistor 1206 having a gate G1, drain D1 and source S1, where D1 and G1 are tied, and a voltage across a capacitor 1204 is provided at G1. The reference current path 1202 also includes a lower transistor 1210 having a gate G2, drain D2 and source S2, where D2 and G2 are tied. A node 1208 is between S1 and D2. The upper and lower transistors are series-connected.

The mirror current path 1216 includes a power supply node 1214 at Vdd, an upper transistor 1218 having a gate G3, drain D3 and source S3, where D3 and G3 are tied, and the voltage across the capacitor 1204 is provided at G3. The mirror current path 1218 also includes a lower transistor 1224 having a gate G4, drain D4 and source S4, where D4 and G4 are tied. A node 1220 is between S3 and D4, connected to an output path 1222, which provides Vhll to the voltage-setting transistor 840 (or 842) of FIG. 8. The upper and lower transistors are series-connected.

The upper transistors 1206 and 1218 are in an upper stage of the circuit 1230, while the lower transistors 1210 and 1224 are in a lower stage of the circuit 1230.

The reference and current minor paths join at an SEN node 1226, which has a comparable voltage as the sense node 854 in FIG. 8. The reference and current minor paths, and the circuit 1230 overall, are series-connected to a resistor R2 1228, which can be controlled digitally, by a digital-to-analog converter (DAC). R2 is series-connected to a transistor 1234 having a gate G5, drain D5 and source S5, where D5 and G5 are tied. A node 1232 is between R2 and D5. A ground node 1236 is provided as a terminus. The transistors in FIG. 12 can be nMOSs, for example. The current in R2 and the transistor 1234 is 2×Iref.

As mentioned, during sensing, the potential on the sense node 854 in the sense circuit of FIG. 8 determines whether a latch will flip, indicating whether or not a storage element is in a conductive state. However, Vsense_trip_point, the maximum voltage on the sense node 854 that can flip the sense circuit, changes with temperature. The lowest current that can make the FLG latch flip is Isense=(Vsense_initial−Vsense_trip_point)×Csen/t, where Vsense_initial is the initial voltage of the sense node at the start of sensing, Csen is a capacitance of the capacitor 884, and t is the sense time. An Isense that does not change with temperature can be obtained by compensating a temperature-dependent variation in Vsense_trip_point with Vsense_initial. To achieve this, the transistor 1224 can be matched to the voltage-setting transistor 840, the transistor 1234 can be matched to the voltage-sensing transistor 860, and Iref can be provided using a bandgap reference voltage, as discussed.

Regarding the matching, the transistor 1224 can be matched to the voltage-setting transistor 840, and the transistor 1234 can be matched to the voltage-sensing transistor 860, in one or more aspects of transistor size, type, orientation on a common substrate die and manufacturing process. For example, transistors can be matched in size by having length and/or width dimensions substantially in common, e.g., within 5-10%. A transistor type can include the nMOS type among other possible types. An orientation can include a word line or bit line direction, for instance. A manufacturing process can be matched among transistors by fabricating the transistors in a common fabrication process, e.g., using common lithographic steps, for instance. Generally, these matching aspects will result in transistors with a common threshold voltage and temperature dependency.

We match the transistors 1224 and 840 to have substantially the same absolute threshold voltage, and the same rate of change of the threshold voltage across temperature (e.g., temperature coefficient). That is done by making the transistors look the same physically. Similarly, we match the transistors 1234 and 860.

Iref can be expressed by Iref=Vbg/R1. R1 can match the DAC-controlled resistor R2, and have a positive temperature coefficient, so that its resistance increases as temperature increases. A temperature coefficient can be expressed in terms of a change in temperature relative to a change in voltage, e.g., $\Delta T/\Delta V$. Since Iref decreases as temperature increases, the voltage across R2 is constant across different temperatures due to the matching of the resistors R1 and R2. Specifically, the voltage across R2 is V2=k1×Iref×R2=k1×(Vbg/R1)×R2=k1×Vbg, which is temperature-independent (k1 is a constant). The DAC can range from, e.g., 0.5 V to 1.3 V. It is the voltage swing in the sense node for a marginally conductive storage element. The DAC provides flexibility regarding sensing timing, e.g., discharge time, and sensing current. The DAC provides the flexibility to adjust the marginal sensing current. By adjusting $\Delta V$, we are adjusting current. The DAC controls the $\Delta V$, which can translate into sensing different marginal storage element currents. Generally, Iref exhibits a variation with temperature based on a temperature coefficient, and R2 has a temperature coefficient which offsets the variation, at least in part.

In analyzing the voltages at different locations in the voltage generator 1201, Vds(5) is the voltage from node 1232 to node 1236, V(R2)=2×Iref×R2 is the voltage from node 1226 to 1232, Vds(4) is the voltage from node 1220 to 1226, Vds(3) is the voltage from node 1214 to node 1220, Vds(2) is the voltage from node 1208 to node 1226, and Vds(1) is the voltage from node 1200 to node 1208. The voltage Vc across the capacitor 1204, which is the voltage at G1 and G3, is Vhll+Vt(3)+Vov(3), where Vt(3) is the threshold voltage, and Vov(3) is the overdrive voltage (also the gate-to-source voltage Vgs(3)), of the transistor 1210. The capacitor 1204 is a decoupling capacitor. When the voltage generator 1201 is connected to a load, the Vhll node 1220 may drop in voltage because of charge sharing with the load. The decoupling capacitor can help Vc to keep its original level, which is used to drive Vhll up through transistor 1218.

Vov changes with temperature. In a first order calculation, assume Vov<<Vth, so Vhll=Vth(4)+k×Vbg+Vth(5), where Vth(4) is the threshold voltage of transistor 1224, Vth(5) is the threshold voltage of transistor 1234, and k=R2/R1. Since Vov changes with temperature, Iref also changes with temperature. We adjust the multiply factor of transistor 1234 to match Vov(5)+Vov(4)+Vth(5) with Vsense_trip_point. Vov(5) and Vov(4) are the overdrive voltages of the transistors 1234 and 1224, respectively. In the sense circuit, the sense node is used to flip a latch within a very short time. Simulations can be performed to quantify Vsense_trip_point variations with temperature, and match that variation with Vov(5)+Vov(4)+Vth(5).

The voltage of the SEN node 1226 of the voltage generator 1201 is the same as the voltage of the sense node 854 in the sense circuit of FIG. 8, as a first order approximation.

With the voltage generator 1201, a voltage difference $\Delta V$=Vsense_initial−Vsense_trip_point is substantially temperature-independent. Moreover, temperature variations which might be introduced by other sense circuit control voltages can be substantially eliminated if the voltages are generated with the same Iref.

Figure 13:
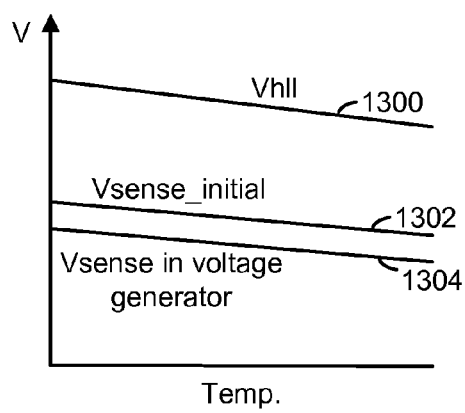
FIG. 13 depicts variations in sense voltages with temperature.

FIG. 13 depicts variations in sense voltages with temperature. The results are from a simulation of a temperature corner variation. It shows a variation of about 200 mV from −40 C to 125 C. The size of the transistors in the voltage generator 1201 can be optimized so that variations in the Vsense_trip_point match variations in Vsense_initial, and the voltage difference between them is substantially constant, e.g., within +/−5-10%. Line 1300 represents Vhll, line 1302 represents the voltage at the SEN node 1226 in the voltage generator, and line 1304 represents the voltage at the sense node 854 (FIG. 8) in the sense circuit. The difference between lines 1300 and 1302, which represents the threshold voltage of the HLL transistor, is substantially constant. Similarly, the difference between lines 1302 and 1304 is substantially constant. The total error due to corner variations is less than 10 mV, which translates to less than a 1% error in sensing.

Figure 14:
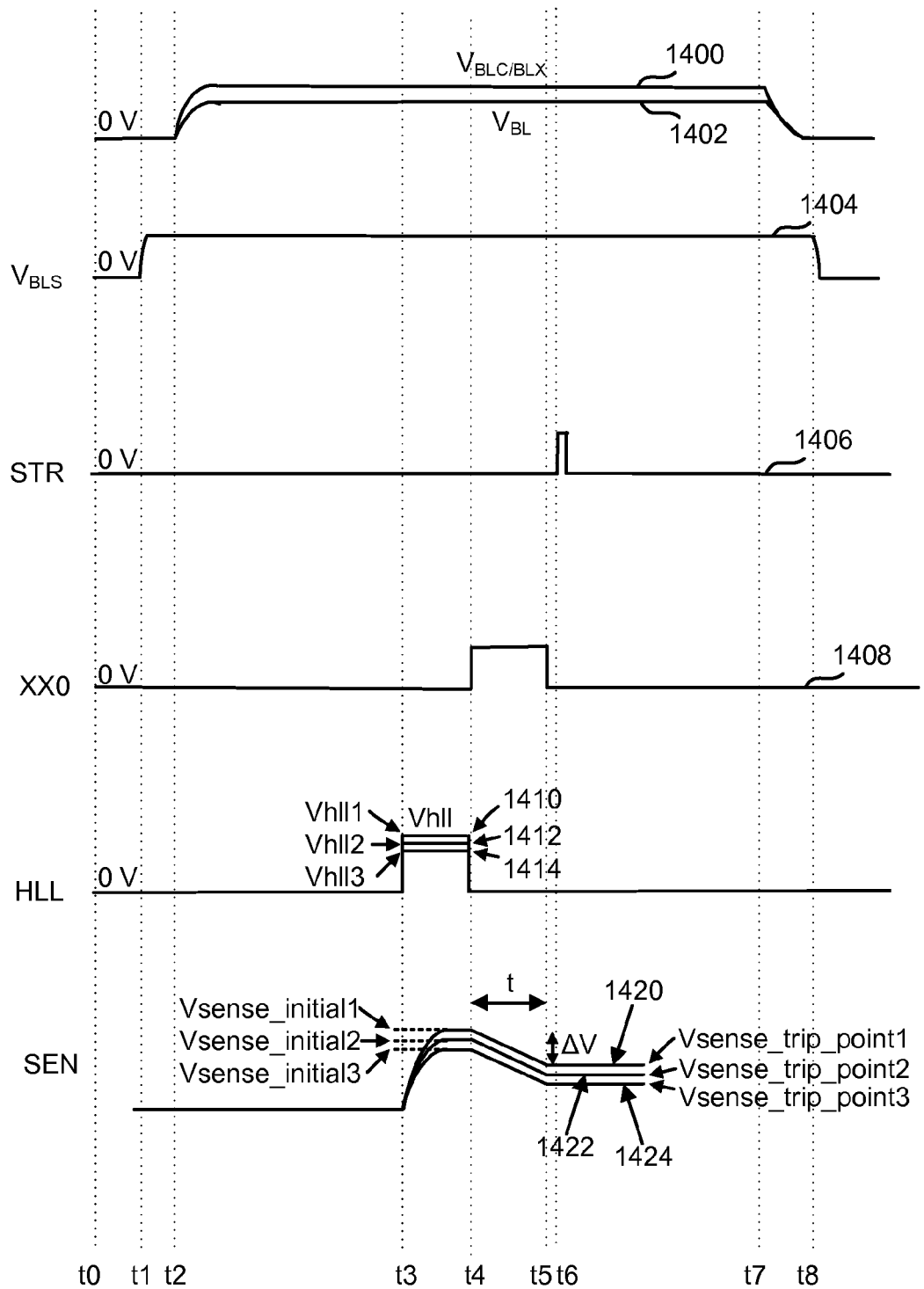
FIG. 14 depicts a time line of a sensing operation.

FIG. 14 depicts a time line of a sensing operation. The waveforms depict voltages of the sense circuit of FIG. 8 at different time points t0-t8. The waveforms are not to scale. During a sensing operation, the bit line voltage VBL (waveform 1402) of a bit line associated with the sense circuit is raised by raising the voltage (waveform 1400) on the BLC transistor 878 and the BLX transistor 850 from t2-t7 to a level VBLC/BLX. For example, VBL may be equal to VBLC−Vth of the BLC transistor 878. The BLS transistor 880 is also made conductive from t1-t8 by raising its voltage (waveform 1404) to allow the bit line 890 to communicate with the sense circuit 801. A strobe sense signal 1406 (for STR transistor 858 in FIG. 8) indicates when sensing occurs, that is, when a latch value is evaluated to determine if it has been flipped by the NSEN transistor 860. Specifically, after the sense node is discharged for a time period t, STR is toggled (at t6). If the sense node voltage is above the trip point, then toggling STR will discharge FLG through the FCO transistor 826 and FLG path 828. On the other hand, if the sense node voltage is below the trip point, there is no discharge current from FLG, so FLG stays high.

Waveform 1408 is the voltage of the XX0 transistor 856, indicating that the transistor is made conductive from t4-t6, corresponding to a discharge period of the sense node. Waveform 1410, 1412 and 1414 represent different example voltages Vhll1, Vhll2 and Vhll3, respectively, which can be provided by the voltage generator 1201 (FIG. 12) to the HLL transistor 840 from t3-t4 for different temperatures. For example, Vhll1 may be provided for a temperature T1, Vhll2 may be provided for a temperature T2, and Vhll3 may be provided for a temperature T3, where Vhll1>Vhll2>Vhll3 and T1<T2<T3. A higher voltage can be provided when temperature is lower (see FIG. 13). t3-t4 represents a pre-charge period in which a voltage of the sense node SEN is increased to Vsense_initial. Example waveforms are provided to show that Vsense_initial can vary. These include waveforms 1420, 1422 and 1424 in which Vsense_initial1, Vsense_initial2 and Vsense_initial3, respectively, are provided. t represents a discharge time in which the sense node is allowed to communicate with the bit line to discharge current into the bit line. The sense node may continue to discharge after t5.

Waveform 1420 indicates that Vsense_initial1 and Vsense_trip_point1 correspond to the temperature T1, waveform 1422 indicates that Vsense_initial2 and Vsense_trip_point2 correspond to the temperature T2, and waveform 1424 indicates that Vsense_initial3 and Vsense_trip_point3 correspond to the temperature T3. As mentioned, advantageously, $\Delta V$=Vsense_initial−Vsense_trip_point can be kept substantially constant at different temperatures and for different manufacturing processes so that sensing fidelity is maintained. Generally, both Vsense_initial and Vsense_trip_point depend on temperature and manufacturing process corner. For example, for a lower temperature, a higher voltage is needed to flip the latch. For a higher temperature, a lower voltage is sufficient to flip the latch.

In one embodiment of the technology described herein, circuitry for use in a non-volatile storage system is provided. The circuitry includes a current mirror circuit comprising a reference current path and a minor current path. The reference current path receives a reference current which is mirrored in the minor current path. A first transistor is in the mirror current path, the first transistor is matched to a voltage-setting transistor (NHLL) in at least one sense amplifier, and the minor current path provides a voltage to the voltage-setting transistor, in response to which the voltage-setting transistor sets an initial voltage at a sense node in the at least one sense amplifier at a start of a sensing period. A resistor is connected in series with the current mirror circuit. A second transistor is connected in series with the current mirror circuit. The second transistor is matched to a voltage-sensing transistor (NSEN) in the at least one sense amplifier. The voltage-sensing transistor senses a final voltage at the sense node at the end of the sensing period.

In another embodiment, circuitry for use in a non-volatile storage system includes a plurality of sense amplifiers, where each sense amplifier is associated with at least one non-volatile storage element, and each sense amplifier comprise a sense node, a voltage-setting transistor and a voltage-sensing transistor. A voltage generator is also provided which provides a common voltage to each voltage-setting transistor. Each voltage-setting transistor sets an initial voltage at its sense node at a start of a sensing period, based on the common voltage, and each voltage-sensing transistor senses a final voltage at the sense node at the end of the sensing period. The voltage generator comprises first and second transistors connected in series, where the first transistor is matched to the voltage-setting transistors, the second transistor is matched to the voltage-sensing transistors, the common voltage is provided at a drain or source of the first transistor, and the common voltage varies with temperature based on temperature coefficients of the first and second transistors.

In another embodiment, a method for operating a non-volatile storage system includes providing a reference current, where the reference current exhibits a variation with temperature based on a temperature coefficient, and the variation is offset, at least in part. The method further includes providing a voltage based on the reference current, where the voltage exhibits a variation with temperature based on temperature coefficients of first and second transistors, the first transistor is matched to a voltage-setting transistor in a sense amplifier, and the second transistor is matched to a voltage-sensing transistor in the sense amplifier. The method further includes coupling the voltage to the voltage-setting transistor.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. Circuitry for use in a non-volatile storage system, comprising:
   a current mirror circuit comprising a reference current path and a mirror current path, the reference current path receives a reference current which is mirrored in the minor current path;
   a first transistor in the minor current path, the first transistor is matched to a voltage-setting transistor in at least one sense amplifier, and the mirror current path provides a voltage to the voltage-setting transistor, in response to which the voltage-setting transistor sets an initial voltage at a sense node in the at least one sense amplifier at a start of a sensing period;
   a resistor connected in series with the current minor circuit; and
   a second transistor connected in series with the current minor circuit, the second transistor is matched to a voltage-sensing transistor in the at least one sense amplifier, the voltage-sensing transistor senses a final voltage at the sense node at the end of the sensing period.

2. The circuitry of claim 1, wherein:
   the current minor circuit is a cascode current minor circuit in which the reference current path is a reference cascode, and the mirror current path is a mirror cascode.

3. The circuitry of claim 2, wherein:
   the mirror cascode includes an additional transistor which is series-connected to the first transistor, and the voltage provided to the voltage-setting transistor is provided from a node which is between the additional transistor and the first transistor.

4. The circuitry of claim 1, wherein:
   the sense node is discharged during the sense period, through a bit line and at least one non-volatile storage element, from the initial voltage to the final voltage, and a difference between the initial voltage and the final voltage indicates whether the at least one non-volatile storage element is in a conductive or non-conductive state.

5. The circuitry of claim 4, wherein:
   the voltage provided to the voltage-setting transistor varies according to temperature coefficients of the first and second transistors, so that the difference is approximately constant across a range of temperatures.

6. The circuitry of claim 1, wherein:
   the reference current exhibits a variation with temperature based on a temperature coefficient, and the resistor has a temperature coefficient which offsets the variation, at least in part.

7. The circuitry of claim 6 wherein:
   the resistor is digitally controlled.

8. The circuitry of claim 1, wherein:
   the resistor is connected between a drain of the second transistor and the current minor circuit, the drain and a gate of the second transistor are connected to each other, and a source of the second transistor is grounded.

9. The circuitry of claim 1, wherein:
   the voltage-setting transistor sets the initial voltage as the voltage provided by the minor current path, less a threshold voltage of the voltage-setting transistor.

10. The circuitry of claim 1, wherein:
    the first transistor and the voltage-setting transistor match in that they are arranged in a common orientation on a common substrate, are of a common type and have common physical dimensions; and
    the second transistor and the voltage-sensing transistor match in that they are arranged in a common orientation on the common substrate, are of a common type and have common physical dimensions.

11. The circuitry of claim 1, wherein:
the current minor circuit is provided in a voltage generator which provides the voltage from the minor current path to each of a plurality of sense amplifiers.

12. Circuitry for use in a non-volatile storage system, comprising:
a plurality of sense amplifiers, each sense amplifier is associated with at least one non-volatile storage element, each sense amplifier comprise a sense node, a voltage-setting transistor and a voltage-sensing transistor; and
a voltage generator, the voltage generator provides a common voltage to each voltage-setting transistor, each voltage-setting transistor sets an initial voltage at its sense node at a start of a sensing period, based on the common voltage, and each voltage-sensing transistor senses a final voltage at the sense node at the end of the sensing period, the voltage generator comprises first and second transistors connected in series, the first transistor is matched to the voltage-setting transistors, the second transistor is matched to the voltage-sensing transistors, the common voltage is provided at a drain or source of the first transistor, and the common voltage varies with temperature based on temperature coefficients of the first and second transistors.

13. The circuitry of claim 12, further comprising:
a resistor connected in series with the first and second transistors, the voltage generator provides the common voltage based on a reference current, the reference current exhibits a variation with temperature based on a temperature coefficient, and the resistor has a temperature coefficient which offsets the variation, at least in part.

14. The circuitry of claim 12, wherein:
in each sense amplifier, the sense node is discharged during the sense period, through a bit line and the at least one non-volatile storage element, from the initial voltage to the final voltage, and a difference between the initial voltage and the final voltage indicates whether the at least one non-volatile storage element is in a conductive or non-conductive state.

15. The circuitry of claim 14, wherein:
the bit line is kept at a fixed potential during the discharging, and the difference between the initial voltage and the final voltage indicates an amount of current which has been discharged through the bit line and the at least one non-volatile storage element.

16. The circuitry of claim 14, wherein:
the common voltage varies according to temperature coefficients of the first and second transistors, so that the difference is approximately constant across a range of temperatures.

17. A method for operating a non-volatile storage system, comprising:
providing a reference current, the reference current exhibits a variation with temperature based on a temperature coefficient, and the variation is offset, at least in part;
providing a voltage based on the reference current, the voltage exhibits a variation with temperature based on temperature coefficients of first and second transistors, the first transistor is matched to a voltage-setting transistor in a sense amplifier, and the second transistor is matched to a voltage-sensing transistor in the sense amplifier; and
coupling the voltage to the voltage-setting transistor.

18. The method of claim 17, wherein:
the reference current is provided in a reference current path in a current mirror circuit, the first transistor is in a mirror current path of the current mirror circuit, and the resistor and the second transistor are series-connected with one another and with the reference current path and the mirror current path.

19. The method of claim 17, wherein the voltage-setting transistor sets an initial voltage in the sense amplifier at a sense node, based on the voltage coupled to the voltage-setting transistor, and the method further comprises:
discharging the sense node during a sense period, through a bit line and at least one non-volatile storage element, from the initial voltage to a final voltage; and
sensing the final voltage using the voltage-sensing transistor, where a difference between the initial voltage and the final voltage indicates whether the at least one non-volatile storage element is in a conductive or non-conductive state, and the variation of the voltage coupled to the voltage-setting transistor with temperature ensures that the difference is approximately constant across a range of temperatures.

20. The method of claim 19, further comprising:
fixing a potential of the bit line during the discharging, where the difference between the initial voltage and the final voltage indicates an amount of current which has been discharged through the bit line and the at least one non-volatile storage element.

* * * * *